United States Patent [19]

Lehrer et al.

[11] 4,442,449

[45] Apr. 10, 1984

[54] BINARY GERMANIUM-SILICON INTERCONNECT AND ELECTRODE STRUCTURE FOR INTEGRATED CIRCUITS

[75] Inventors: William I. Lehrer, Los Altos; Bruce E. Deal, Palo Alto, both of Calif.

[73] Assignee: Fairchild Camera and Instrument Corp., Mountain View, Calif.

[21] Appl. No.: 243,986

[22] Filed: Mar. 16, 1981

[51] Int. Cl.$^3$ .................... H01L 29/163; H01L 29/54
[52] U.S. Cl. ..................... 357/67; 148/33.1; 148/33.4; 357/59; 357/71; 420/556; 420/578; 428/620; 428/641; 428/929
[58] Field of Search .................. 420/556, 578; 357/59, 357/67, 71; 428/929, 620, 641; 148/33.1, 33.4

[56] References Cited

U.S. PATENT DOCUMENTS

| | | | |
|---|---|---|---|
| 2,981,877 | 4/1961 | Noyce | 29/578 X |
| 3,279,954 | 10/1966 | Cody et al. | 420/578 X |
| 3,544,311 | 12/1970 | DeBucs et al. | 420/556 |
| 3,699,395 | 10/1972 | Boleky | 357/67 X |
| 3,740,835 | 6/1973 | Duncan | 357/67 X |

OTHER PUBLICATIONS

Gardiner et al., "Ultrashallow Emitter Junctions", I.B.M. Tech. Discl. Bull., vol. 11, No. 10, Mar. 1969, p. 1340.

*Primary Examiner*—W. G. Saba
*Attorney, Agent, or Firm*—Kenneth Olsen; Carl L. Silverman; Alan H. MacPherson

[57] ABSTRACT

An interconnect structure for use in integrated circuits comprises a germanium-silicon binary alloy. Such an alloy is deposited on the semiconductor wafer from the co-deposition of germanium and silicon using chemical vapor deposition techniques of a type commonly used in the semiconductor industry. The resulting alloy can be oxidized, selectively removed and doped with selected impurities to provide a conductive lead pattern of a desired shape on the surface of a wafer.

7 Claims, No Drawings

BINARY GERMANIUM-SILICON INTERCONNECT AND ELECTRODE STRUCTURE FOR INTEGRATED CIRCUITS

BACKGROUND OF THE INVENTION

1. Field of the Invention

This invention relates to conductive interconnect structures for use in integrated circuits and in particular to a binary conductive material comprising a germanium-silicon binary alloy suitable for use both as a conductive interconnect and as a conductive gate.

2. Description of the Prior Art

Integrated circuits comprise a plurality of selectively doped regions formed in semiconductor material interconnected by conductive leads formed on and adherent to insulation overlying the semiconductor material. A typical conductive interconnect structure is disclosed in U.S. Pat. No. 2,981,877 entitled "Semiconductor Device-and-Lead Structure" issued Apr. 25, 1961 on an invention of Noyce. Typically the interconnect leads adhering to the surface of the semiconductor device are formed of a conductive material such as aluminum or doped polycrystalline silicon. One problem with aluminum is that it melts at approximately 650° C. thereby making unfeasible high temperature processing of the integrated circuit following the deposition of aluminum. While doped polycrystalline silicon has a much higher melting temperature and thus avoids this problem, the resistivity of even doped polycrystalline silicon is sufficiently higher than that of metal to significantly reduce the speed of operation of an integrated circuit. Accordingly, it would be advantageous to find a material which is appropriate for use as conductive interconnects and contact regions on integrated circuits and which possesses a lower resistivity than polycrystalline silicon and which is capable of sustaining higher temperatures than aluminum.

SUMMARY OF THE INVENTION

In accordance with this invention, a binary alloy of germanium and silicon has been fabricated which possesses conductivity superior to that of polycrystalline silicon, is preferentially oxidizable, is capable of being doped with phosphorus to a higher doping level than is polycrystalline silicon, and is easily formed using equipment currently of the type used in the formation of polycrystalline silicon.

DETAILED DESCRIPTION OF THE INVENTION

The co-deposition of germanium and silicon by chemical vapor deposition ("CVD") techniques of a type commonly employed in the semiconductor industry yields a series of binary solid alloys. Typically, these alloys comprise a mixture of silicon and germanium with the silicon and germanium atoms being mechanically intermingled. The germanium atoms are connected and bonded to other germanium atoms and inextricably entwined with silicon atoms which are bonded to other silicon atoms. The resulting structure has a resistivity in ohm-cm which varies from approximately 50 ohm-cm for a 100% pure undoped polycrystalline germanium structure to approximately $8 \times 10^5$ ohm-cm for a 100% pure undoped polycrystalline silicon structure. A 50—50 by weight undoped silicon-germanium structure has a resistivity of about $7 \times 10^4$ ohm-cm, which comprises a resistivity about one order of magnitude less than that for pure polycrystalline silicon.

The composite silicon-germanium structure has the property that the silicon component of the alloy oxidizes preferentially. The diffusion constant of germanium atoms in the resulting silicon dioxide is not known but is believed to be very small, whereas the diffusion constant of germanium atoms in the germanium-silicon alloy is relatively high. The diffusion constant "D" of germanium in silicon is given by the equation $D=7.8 \exp(-68500/RT)$. The result is that when the alloy is placed in an oxidizing atmosphere, the silicon component of the germanium-silicon alloy oxidizes. The germanium atoms released by the oxidation of the silicon migrate and diffuse into the remaining alloy.

The alloy has a lower melting point than a pure polycrystalline silicon which means that the germanium-silicon alloy can be annealed at lower temperatures than pure polycrystalline silicon. Since the solid solubility of phosphorus is higher in germanium than silicon, the germanium-silicon alloy can be doped to a higher degree than is customary with polycrystalline silicon films. Furthermore, the diffusion constant of phosphorus in germanium is an order of magnitude higher than in silicon thereby allowing equilibrium of phosphorus in germanium to be reached sooner and at a lower temperature than in silicon.

The deposition process makes use of the thermal decomposition of a mixed germane and silane source gas in a reducing carrier, hydrogen or nitrogen. This mixture is reacted upon a suitable substrate held at temperatures between 450° C.–700° C. resulting in the formation of a binary alloy of germanium and silicon. The reaction formula is:

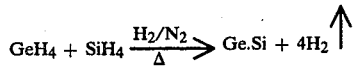

The resultant alloy film can then be heat treated at temperatures between 800° C.–900° C. and doped with phosphorus to reduce its resistivity. Standard polycrystalline silicon techniques can be used to further process this alloy through photolithographic delineation and oxidation if needed. Obviously, this alloy can also be fabricated by a variety of deposition techniques including physical vapor deposition methods such as sputtering from an appropriate source (single crystal or pressed powder) as well as conventional chemical vapor deposition methods such as low pressure chemical vapor deposition (LPCVD), plasma deposition, and atmospheric chemical vapor deposition (ACVD).

A typical deposition method for producing 50—50 germanium-silicon alloy films in a commercial atmospheric CVD epitaxial reactor employs the following process parameters:

| | |
|---|---|
| Substrate temperature | 600° C.–625° C. |
| Deposition Rate | 400–500 A/minute |
| Nitrogen | 50 Liters/minute |
| Silane | 29 cc/minute |
| Germane | 16 cc/minute |

A ten minute deposition yields a 5000 Å thick film which can then be heat treated at 900° C. and doped with phosphorous from a PH$_3$ source using well-known IC methods. This results in a film resistivity of between $10^3$–$10^4$ ohm-cm or lower.

The resulting alloy of a 50—50 mixture by weight will oxidize at pressures up to 40 atmospheres in wet $O_2$ to yield approximately 5000 angstroms at 1063° C. of pure $SiO_2$. The germanium atoms are dispersed throughout the $SiO_2$ but are relatively immobile in this glass. During oxidation, it is believed that the germanium atoms redistribute and form a germanium rich layer underneath the $SiO_2$, particularly when germanium is less than about 50 percent of the alloy, by atomic percent.

The advantages of the above structure are lower temperature processing and the use of thinner films of conductive material for a given ohms/square resistivity. The resulting structure is particularly useful for MOS and possibly bipolar interconnects.

What is claimed is:

1. An integrated circuit semiconductor structure comprising a semiconductor substrate, a plurality of selectively doped regions in said substrate as part of an integrated circuit and means for conductively interconnecting said regions, said interconnecting means comprising a germanium-silicon binary alloy.

2. Structure as in claim 1 wherein said binary alloy is selectively doped with a selected impurity to lower its resistivity.

3. Structure as in claim 2 wherein said impurity comprises phosphorus.

4. Structure as in claim 3 wherein said phosphorus is saturated in said germanium-silicon alloy.

5. Structure as in claim 1 in which said binary alloy contains about 50% by weight silicon and about 50% by weight germanium.

6. Structure as in claim 1 in which said binary alloy interconnect means is oxidized whereby germanium atoms are dispersed within a silicon oxide film.

7. Structure as in claim 6 wherein during oxidation germanium atoms redistribute and form a germanium rich layer underneath the silicon oxide film.

* * * * *